United States Patent [19]

Hsu

[11] Patent Number: 5,576,227
[45] Date of Patent: Nov. 19, 1996

[54] PROCESS FOR FABRICATING A RECESSED GATE MOS DEVICE

[75] Inventor: Chen-Chung Hsu, Taichung, Taiwan

[73] Assignee: United Microelectronics Corp., Hsinchu, Taiwan

[21] Appl. No.: 333,219

[22] Filed: Nov. 2, 1994

[51] Int. Cl.$^6$ .................. H01L 21/265; H01L 21/44; H01L 21/48
[52] U.S. Cl. .................. 437/35; 437/40; 437/44; 437/200; 437/203; 148/DIG. 105
[58] Field of Search .................. 437/35, 40 RG, 437/41 RG, 44, 203, 200; 148/DIG. 105

[56] References Cited

U.S. PATENT DOCUMENTS

| | | | |
|---|---|---|---|
| 5,270,257 | 12/1993 | Shin | 437/203 |
| 5,300,447 | 4/1994 | Anderson | 437/40 RG |
| 5,371,024 | 12/1994 | Hieda et al. | 437/40 RG |

Primary Examiner—Mary Wilczewski
Assistant Examiner—Brian K. Dutton
Attorney, Agent, or Firm—Ladas & Parry

[57] ABSTRACT

A process for fabricating a MOS device having a recessed gate on a silicon substrate. Source/drain regions are formed by implanting impurities of a first conductivity type into a silicon substrate. A trench is formed in the silicon substrate, the trench being separated from the source/drain regions by side wall spacers on side walls of the trench. The source/drain regions extend to areas underlying the sidewall spacers. An anti-punchthrough region is formed by implanting impurities of a second conductivity type into a portion of the silicon substrate underlying the trench. A gate layer is formed within the trench, the gate layer being separated from the anti-punchthrough region by a gate oxide layer.

14 Claims, 4 Drawing Sheets

PROCESS FOR FABRICATING A RECESSED GATE MOS DEVICE

BACKGROUND OF THE INVENTION

1. Field of the Invention

This invention relates in general to the fabrication of integrated circuit devices, and more particularly to a process for fabricating MOS devices having a recessed gate, improved isolation between gate to source/drain and capacitance reduction of parasitic capacitors between the gate layer and the source/drain regions.

2. Description of the Prior Art

Metal Oxide Semiconductor Field Effect Transistors (MOSFETs) are widely used semiconductor devices. They can be utilized as switches, amplifiers, or memory devices. However, in the conventional process for fabricating the MOSFET, a gate structure including a gate oxide layer and a gate electrode is formed on the surface of a silicon substrate, which leads to a non-flat surface. As the size of these devices becomes smaller and smaller, it becomes increasingly difficult to perform fabrication photolithography procedures on such non-flat substrate surfaces.

Therefore, a recessed gate MOS device is proposed which overcomes the non-flat surface problem. A prior art process for fabricating such a recessed gate MOS device is described with reference to FIG. 1 as follows. First, a field oxide 11 is formed on silicon substrate 10 by a conventional isolation technique, such as a LOCal Oxidation of Silicon (LOCOS) process, to define the active area. A portion of silicon substrate 10 within the active area is etched, for example, by reactive ion etching (RIE), to form a trench. Next, gate oxide layer 12 is formed by either thermal oxidation or chemical vapor deposition (CVD) to cover the bottom and the side walls of the trench. Polysilicon gate layer 13 is formed on gate oxide layer 12 within the trench by CVD and RIE processes. Thus, a recessed gate structure including gate oxide layer 12 and polysilicon gate layer 13 is formed in the trench resulting in a flat surface. Finally, the prior art device is completed by implanting N type impurities, such as arsenic ions, into silicon substrate 10 to form $N^+$ source/drain regions 14 that are spaced apart and adjacent to the side walls of the trench. To gain a higher conductivity, titanium silicide ($TiSi_2$) layer 15 is formed on the surfaces of the gate layer 13 and the $N^+$ source/drain regions 14 by first sputtering a titanium layer and then performing a rapid thermal anneal (RTA) process, which is well known in the art.

However, the prior art process for fabricating recessed gate MOS devices suffers from the following drawbacks:

(1) Gate oxide layer 12 is formed along the bottom and the side walls of the trench. Thus, corner areas I of gate oxide layer 12 are easily broken down due to the point discharge.

(2) Since a portion of gate oxide layer 12 is sandwiched by the polysilicon gate layer 13 and $N^+$ source/drain regions 14, parasitic capacitors are formed at positions II that decrease the speed of the device operation.

(3) $N^+$ source/drain regions 14 and polysilicon gate layer 13 are isolated only by thin gate oxide layer 12. After the formation of titanium silicide 15, surface leakage will occur at positions III that reduce the reliability of the device.

SUMMARY OF THE INVENTION

It is therefore an object of the present invention to provide a process for fabricating recessed MOS devices, which will: (1) prevent the breakdown of the gate oxide layer due to the point discharge, (2) improve the isolation between the gate layer and the source/drain regions, and (3) reduce the capacitance of parasitic capacitors between the gate layer and the source/drain regions.

Accordingly, a new process for fabricating a recessed gate MOS device on a silicon substrate is achieved. Source/drain regions are formed by implanting impurities of a first conductivity type into a silicon substrate. A trench is formed in the silicon substrate, the trench being separated from the source/drain regions by side wall spacers on side walls of the trench. The source/drain regions extend to areas underlying the sidewall spacers. An anti-punchthrough region is formed by implanting impurities of a second conductivity type into a portion of the silicon substrate underlying the trench. A gate layer is formed within the trench, the gate layer being separated from the anti-punchthrough region by a gate oxide layer.

In accordance with a preferred embodiment of the invention, a barrier layer is formed on a predetermined position of the silicon substrate. First sidewall spacers are formed on side walls of the barrier layer. Source/drain regions extending to the areas underlying the first sidewall spacers are formed by implanting impurities of a first conductivity type into the silicon substrate at an angle using the barrier layer and the first sidewall spacers as masks. A metal silicide layer is formed on the surface of the source/drain regions. A trench is formed by sequentially etching the barrier layer and a portion of the silicon substrate underlying the barrier layer using the first sidewall spacers and the metal silicide layer as masks. Second sidewall spacers are formed on side walls of the trench. An anti-punchthrough region is formed underlying the trench by implanting impurities of a second conductivity type into the silicon substrate. A gate oxide layer and a gate layer are formed sequentially in the trench completing the recessed gate MOS device.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENTS

A first preferred embodiment of the present invention will now be described with reference to FIGS. 2A through 2F.

Figure 2A:
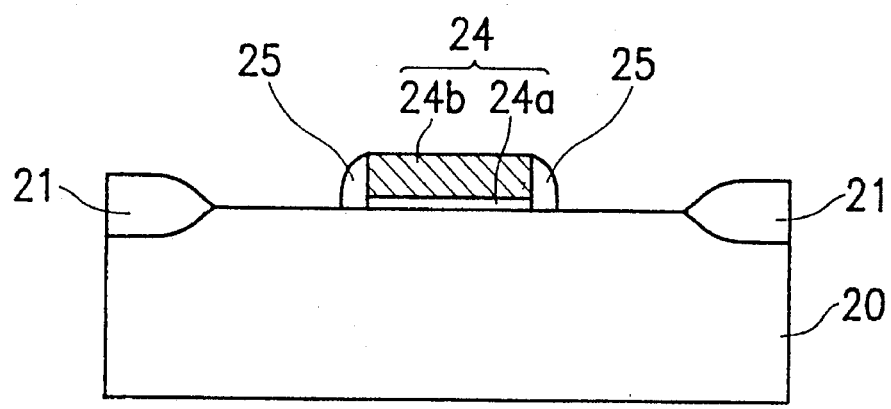
FIGS. 2A to 2F are cross-sectional views showing the process steps of a first preferred embodiment according to the present invention.

Referring to FIG. 2A, field oxide layer 21 is formed on silicon substrate 20 by a conventional LOCOS process to define the active area. That is, pad oxide layer 24a and silicon nitride layer 24b are first deposited, preferably by CVD, and then patterned by conventional lithography and etching processes to define a mask for the field oxide formation. After field oxide layer 21 has been formed on silicon substrate 20 by thermal oxidation, silicon nitride layer 24b and pad oxide layer 24a are patterned again by lithography and etching processes to form barrier layer 24 covering a portion of silicon substrate 20 that will form a recessed gate. A silicon dioxide layer is formed by CVD overlying the exposed surface of silicon substrate 20 and barrier layer 24. The silicon dioxide layer is next etched back preferably by RIE, so as to leave first sidewall spacers 25 on the side walls of barrier layer 24.

Figure 2B:
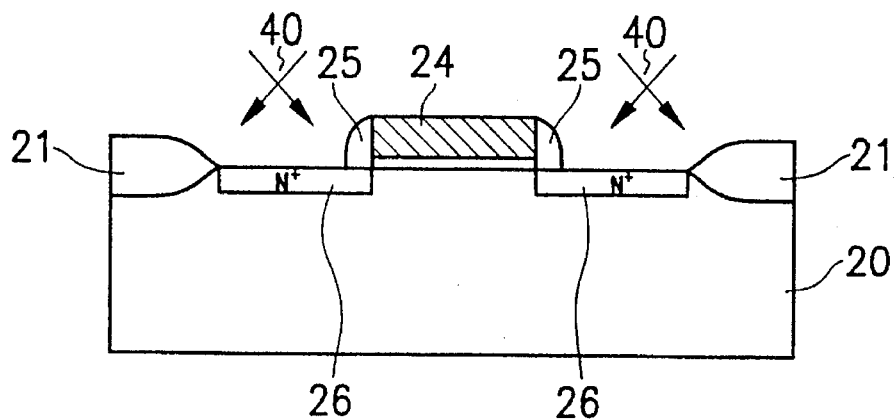

Referring now to the FIG. 2B, N type impurities, such as arsenic ions, are implanted (as depicted by arrows 40), for example, with an energy of about 70 KeV and with dosage of about $5 \times 10^{15}$ atoms/cm$^2$, into silicon substrate 20 to form N$^+$ source/drain regions 26, using barrier layer 24, including first sidewall spacers 25, as masks. Since the impurities are implanted at an angle, for example, of about 45 degree, N$^+$ source/drain regions 26 are extended to the areas underlying first sidewall spacers 25.

Figure 2C:
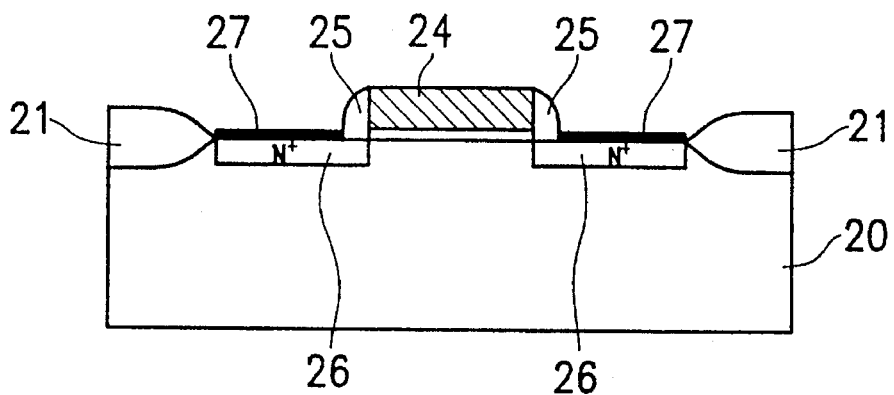

Referring now to FIG. 2C, a self-aligned silicide (salicide) process is then performed. A metal layer (not shown), such as a titanium (Ti) layer, is formed on the entire substrate by sputtering. After a rapid thermal anneal (RTA) procedure, such as at a temperature of about 650° C. for 20 to 60 seconds, portions of the titanium layer above N$^+$ source/drain regions 26 are reacted with silicon substrate 20 to form titanium silicide (TiSi$_2$) layer 27. The remaining portion of the titanium layer is then removed by an appropriate solvent.

Figure 2D:
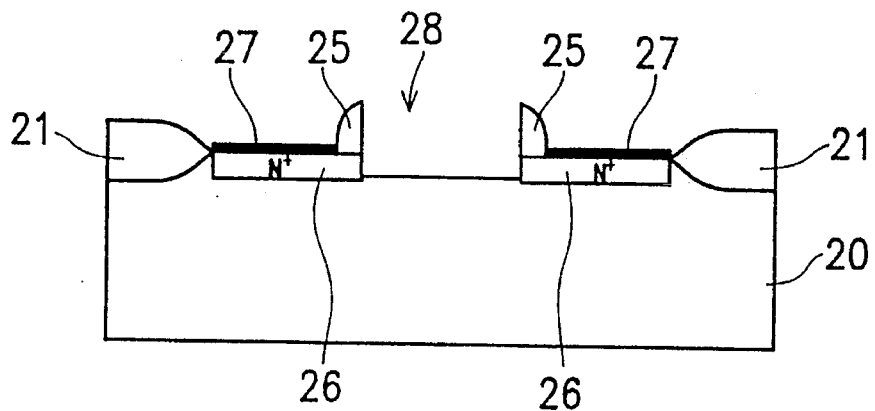

Turning now turn to FIG. 2D, using first sidewall spacers 25 and titanium silicide layer 27 as masks, barrier layer 24 and portion of silicon substrate 20 underlying barrier layer 24 are etched by RIE to form trench 28.

Figure 2E:
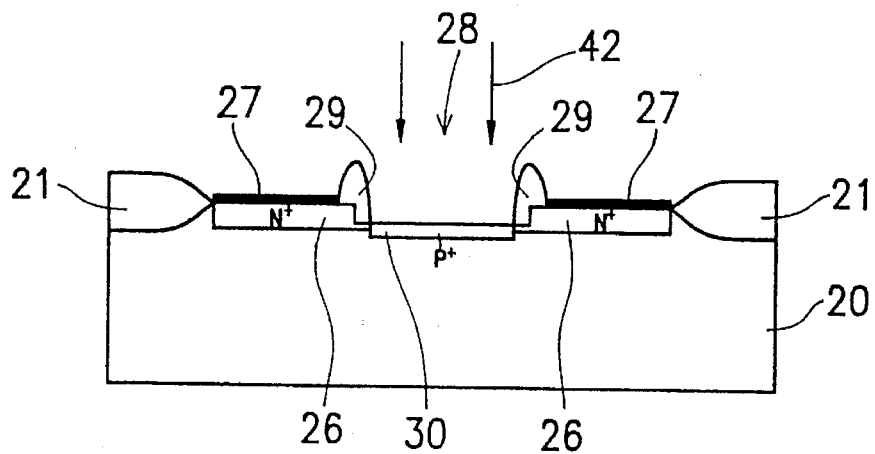

Referring to FIG. 2E, second sidewall spacers 29, such as silicon dioxide sidewall spacers, are formed on side walls of trench 28 by the same deposition and etching back processes that have been described with respect to FIG. 2A. P type impurities, such as boron ions, are implanted (as depicted by arrows 42), for example, with an energy of about 50 KeV and with a dosage of about $1 \times 10^{12}$ atoms/cm$^2$, into a portion of silicon substrate 20 underlying trench 28 to form anti-punchthrough region 30. As is known in the art, an optional thermal anneal process is usually performed to drive-in and activate the implanted impurities.

Figure 2F:
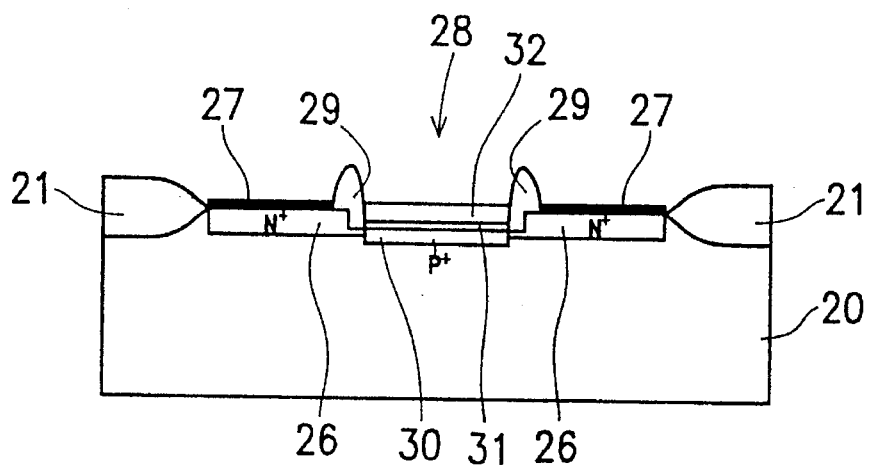

Turning to FIG. 2F, gate oxide layer 31 is formed on the bottom of trench 28 by thermal oxidation or CVD. A polysilicon layer is first deposited by CVD and then etched back by RIE to form polysilicon gate layer 32 on gate oxide layer 31, completing the fabrication of a recessed gate MOS device according to one preferred embodiment of this invention.

Figure 1:
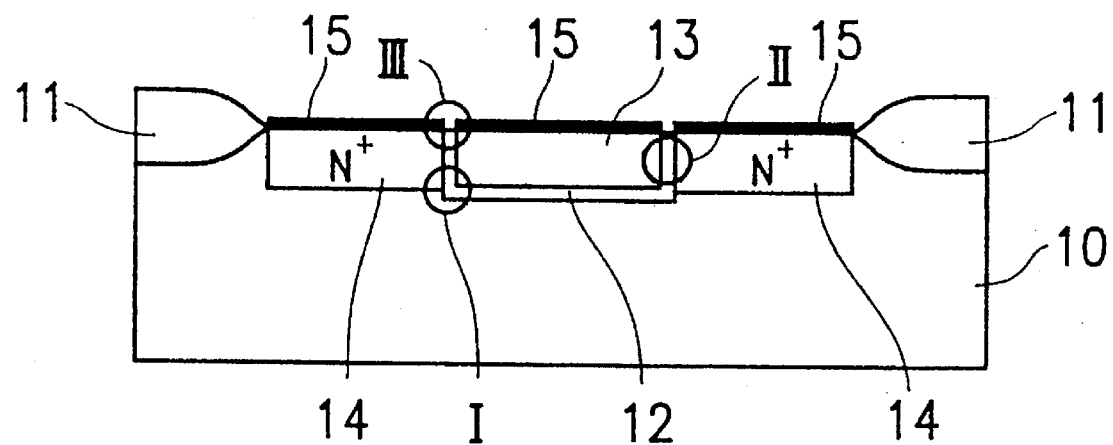
FIG. 1 schematically illustrates, in cross-sectional view, a prior art recessed gate MOS device.

Therefore, with the formation of both first and second sidewall spacers 25 and 29, the isolation between polysilicon gate layer 32 and N$^+$ source/drain regions 26 is improved, and the capacitance of parasitic capacitors therebetween is reduced as well. Since gate oxide layer 31 is only formed on the bottom of the trench 28, consequently, problematic corner areas I shown in FIG. 1 are eliminated. Thus, the quality of gate oxide layer 31 is improved by preventing the point discharge.

Figure 3:
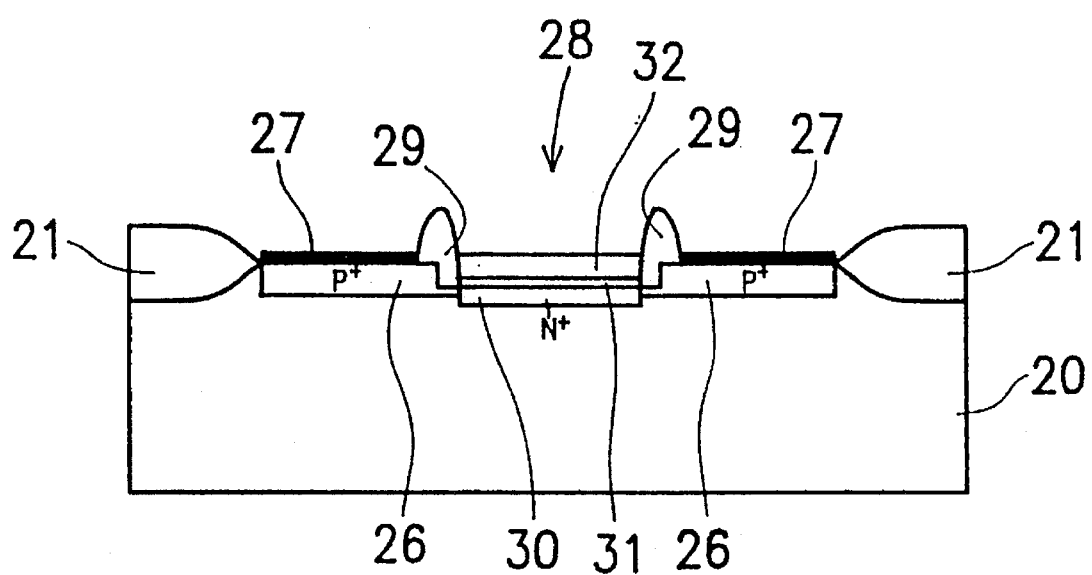
FIGS. 3 schematically illustrates, in cross-sectional view, a second preferred embodiment of the recessed gate MOS device according to the present invention.

Although the description of the first preferred embodiment relates to a recessed gate MOS device with N$^+$ source/drain regions and P$^+$ anti-punchthrough region, the principle of the present invention may be applied to a recessed gate MOS device with P$^+$ source/drain regions and N$^+$ anti-punchthrough region, as is shown in FIG. 3. In addition, persons skilled in the art will similarly appreciate that the particular conditions, parameters, and materials discussed with reference to the preferred embodiment of the present invention may be changed or modified without departing from the scope and spirit of the invention. Therefore, the preferred embodiment of the present invention is only intended to describe the invention, not to limit its scope, which is defined in the claims below.

What is claimed is:

1. A process for fabricating a MOS device having a recessed gate on a silicon substrate, comprising the steps of:

forming a barrier layer on said silicon substrate where a gate electrode is to be formed;

forming first sidewall spacers on side walls of said barrier layer;

implanting impurities of a first conductivity type into said silicon substrate at an oblique angle to form source/drain regions by using said barrier layer and said first sidewall spacers as a first mask, wherein said source/drain regions extending to the areas underlying said first sidewall spacers;

forming a metal silicide layer on the surface of said source/drain regions;

sequentially etching said barrier layer and portion of said silicon substrate underlying said barrier layer to form a trench by using said first sidewall spacers and said metal silicide layer as a second mask;

forming second sidewall spacers on side walls of said trench;

implanting impurities of a second conductivity type into portion of said silicon substrate underlying said trench to form an anti-punchthrough region; and sequentially forming a gate oxide layer and a gate layer in said trench.

2. The process for fabricating a MOS device having a recessed gate of claim 1, wherein said first conductivity type is N type and said second conductivity type is P type.

3. The process for fabricating a MOS device having a recessed gate of claim 1, wherein said first conductivity type is P type and said second conductivity type is N type.

4. The process for fabricating a MOS device having a recessed gate of claim 1, wherein said barrier layer includes a pad oxide layer and a silicon nitride layer.

5. The process for fabricating a MOS device having a recessed gate of claim 1, wherein said first sidewall spacers are made of silicon dioxide.

6. The process for fabricating a MOS device having a recessed gate of claim 1, wherein said impurities of said first conductivity type are implanted at an angle of about 45 degree with the surface of said silicon substrate.

7. The process for fabricating a MOS device having a recessed gate of claim 1, wherein said impurities of said first conductivity type are arsenic ions with implantation energy of about 70 KeV and with dosage of about $5 \times 10^{15}$ atoms/cm$^2$.

8. The process for fabricating a MOS device having a recessed gate of claim 1, wherein said metal silicide layer is made of titanium silicide.

9. The process for fabricating a MOS device having a recessed gate of claim 1, wherein said second sidewall spacers are made of silicon dioxide.

10. The process for fabricating a MOS device having a recessed gate of claim 1, wherein said impurities of said second conductivity type are boron ions with implantation energy of about 50 KeV and with dosage of about $1 \times 10^{12}$ atoms/cm$^2$.

11. The process for fabricating a MOS device having a recessed gate of claim 1, wherein said gate layer is made of polysilicon.

12. A method of fabricating a recessed gate MOS device comprising the steps of:

forming a barrier layer on a silicon substrate where a gate electrode is to be formed, the barrier layer having sidewall spacers at side edges of the barrier layer;

forming source/drain regions by implanting impurities of a first conductivity type into said silicon substrate, using the barrier layer and the sidewall spacers as a first mask;

forming a silicide layer on said source/drain regions;

removing the barrier layer and forming a trench in the silicon substrate using the sidewall spacers and silicide layer as a second mask;

forming an anti-punchthrough region by implanting impurities of a second conductivity type into a portion of said silicon substrate underlying said trench; and forming a gate layer within said trench, said gate layer being separated from said anti-punchthrough region by a gate oxide layer.

13. The method of fabricating a recessed gate MOS device of claim 12 wherein said first conductivity type is N-type and said second conductivity type is P-type.

14. The method of fabricating a recessed gate MOS device of claim 12 wherein said first conductivity type is P-type and said second conductivity type is N-type.

* * * * *